(12) United States Patent
Choi et al.

(10) Patent No.: US 11,055,456 B2
(45) Date of Patent: Jul. 6, 2021

(54) HIGH-LEVEL SYNTHESIS (HLS) METHOD AND APPARATUS TO SPECIFY PIPELINE AND SPATIAL PARALLELISM IN COMPUTER HARDWARE

(71) Applicant: LegUp Computing Inc., Toronto (CA)

(72) Inventors: Jongsok Choi, Toronto (CA); Ruolong Lian, Toronto (CA); Andrew Christopher Canis, Toronto (CA); Jason Helge Anderson, Toronto (CA)

(73) Assignee: MICROCHIP TECHNOLOGY INC., Chandler, AZ (US)

( * ) Notice: Subject to any disclaimer, the term of this patent is extended or adjusted under 35 U.S.C. 154(b) by 0 days.

(21) Appl. No.: 16/714,571

(22) Filed: Dec. 13, 2019

(65) Prior Publication Data

US 2020/0117844 A1    Apr. 16, 2020

Related U.S. Application Data (63) Continuation of application No. 15/977,874, filed on May 11, 2018, now Pat. No. 10,579,762.

(60) Provisional application No. 62/506,461, filed on May 15, 2017.

(51) Int. Cl.
   *G06F 30/327* (2020.01)
   *G06F 13/16* (2006.01)
   *G06F 30/3312* (2020.01)

(52) U.S. Cl.
   CPC ........ *G06F 30/327* (2020.01); *G06F 13/1673* (2013.01); *G06F 30/3312* (2020.01)

(58) Field of Classification Search
   CPC ........................... G06F 30/327; G06F 30/3312

USPC ......................................................... 716/104
See application file for complete search history.

(56) References Cited

U.S. PATENT DOCUMENTS

| | | | |
|---|---|---|---|
| 6,856,950 B1* | 2/2005 | Abts | G06F 30/33 703/13 |
| 6,938,246 B2* | 8/2005 | Alford | G06F 11/366 709/238 |
| 6,952,825 B1* | 10/2005 | Cockx | G06F 30/30 718/102 |
| 9,047,427 B1* | 6/2015 | Doucet | G06F 30/398 |
| 9,250,979 B2* | 2/2016 | McKenney | G06F 9/526 |
| 2006/0179429 A1* | 8/2006 | Eggers | G06F 9/3851 717/151 |
| 2013/0125097 A1* | 5/2013 | Ebcioglu | G06F 15/17381 717/136 |
| 2018/0293102 A1* | 10/2018 | Ray | G06T 1/20 |
| 2018/0322386 A1* | 11/2018 | Sridharan | G06T 15/005 |
| 2018/0322387 A1* | 11/2018 | Sridharan | G06N 3/084 |
| 2020/0117844 A1* | 4/2020 | Choi | G06F 30/343 |

* cited by examiner

*Primary Examiner* — Suchin Parihar
(74) *Attorney, Agent, or Firm* — Lance Kreisman; Peninsula Patent Group (57) ABSTRACT

A computer-implemented method for synthesizing a digital circuit is disclosed. The method includes receiving producer instructions defining a producer processing thread; generating a producer register-transfer level (RTL) description of the producer processing thread; receiving consumer instructions defining a consumer processing thread; generating a consumer RTL description of the consumer processing thread; and automatically inferring generation of streaming hardware RTL in response to receiving the producer and consumer instructions.

12 Claims, 9 Drawing Sheets

HIGH-LEVEL SYNTHESIS (HLS) METHOD AND APPARATUS TO SPECIFY PIPELINE AND SPATIAL PARALLELISM IN COMPUTER HARDWARE

CROSS-REFERENCE TO RELATED APPLICATIONS

This application is a Continuation that claims priority to U.S. application Ser. No. 15/977,874, filed May 11, 2018, entitled HIGH-LEVEL SYNTHESIS (HLS) METHOD AND APPARATUS TO SPECIFY PIPELINE AND SPATIAL PARALLELISM IN COMPUTER HARDWARE, which is a Non-Provisional that claims priority to U.S. Provisional Application No. 62/506,461, filed May 15, 2017, entitled SOFTWARE-BASED METHODOLOGY TO SPECIFY PIPELINE AND SPATIAL PARALLELISM IN COMPUTER HARDWARE, all of which are incorporated herein by reference in their entirety.

TECHNICAL FIELD

The disclosure herein relates to electronic design automation (EDA) tools. More particularly, the disclosed embodiments relate to methods, systems, and user interfaces for implementing high-level synthesis (HLS) in a digital design flow.

BACKGROUND

Electronic design automation (EDA) tools are often used to generate a detailed design of a semiconductor circuit. Computer-implemented tools such as computer-aided design (CAD) tools are often used to carry out the design flow. Many of the operations may be implemented as software running on computer servers and/or workstations.

A typical digital design flow may involve generating a system specification that provides design parameters for the semiconductor circuit to one or more of the EDA tools. A circuit implementing the system specification may then be generated manually or automatically (such as by using ready-made IP functions). In conventional design flows, the circuit may be entered by a hardware description language (such as Verilog, VHDL, or any other hardware description language (HDL)). The HDL is described in register transfer level (RTL), which specifies the flow of digital signals and hardware logic between hardware registers. In a logic synthesis operation, an abstract form of desired circuit behavior (typically a register transfer level (RTL) description or behavioral description) is turned into a design implementation in terms of logic gates. In a verification operation, the netlist output by the logic synthesis operation is verified for functionality against the circuit design specification. A physical implementation of the netlist may then be performed, including an analysis to verify functionality, timing and performance across predetermined or user-specified ranges of process, voltage, and temperature parameters. While beneficial for integrated circuit design, using HDL to specify hardware circuitry typically involves a relatively low-level of abstraction, such that the designer often needs to employ significant hardware design skills.

Recently, software-based design tools have been developed to enable software programmers to specify untimed programming code, such as C++, to generate production-quality RTL code. The software-based design tools, known as high-level synthesis (HLS) tools, allow a designer to work more productively at a higher level of design abstraction. Further, since hardware is automatically synthesized from the HLS software, designers with little to no "hardware" design skills may still carry out a design flow.

While conventional HLS tools are beneficial in enabling software programmers to design integrated circuit devices with minimal hardware design skills, the usability of existing HLS tools has room for improvement. Accordingly, what is needed are methods, systems and associated apparatus that improve the usability of HLS in a digital design flow.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of a computer-implemented method for the synthesis of a digital design are disclosed. The method includes receiving producer instructions defining a producer processing thread; generating a producer register-transfer level (RTL) description of the producer processing thread; receiving consumer instructions defining a consumer processing thread; generating a consumer RTL description of the consumer processing thread; and automatically inferring generation of streaming hardware RTL in response to receiving the producer and consumer instructions.

Figure 1:
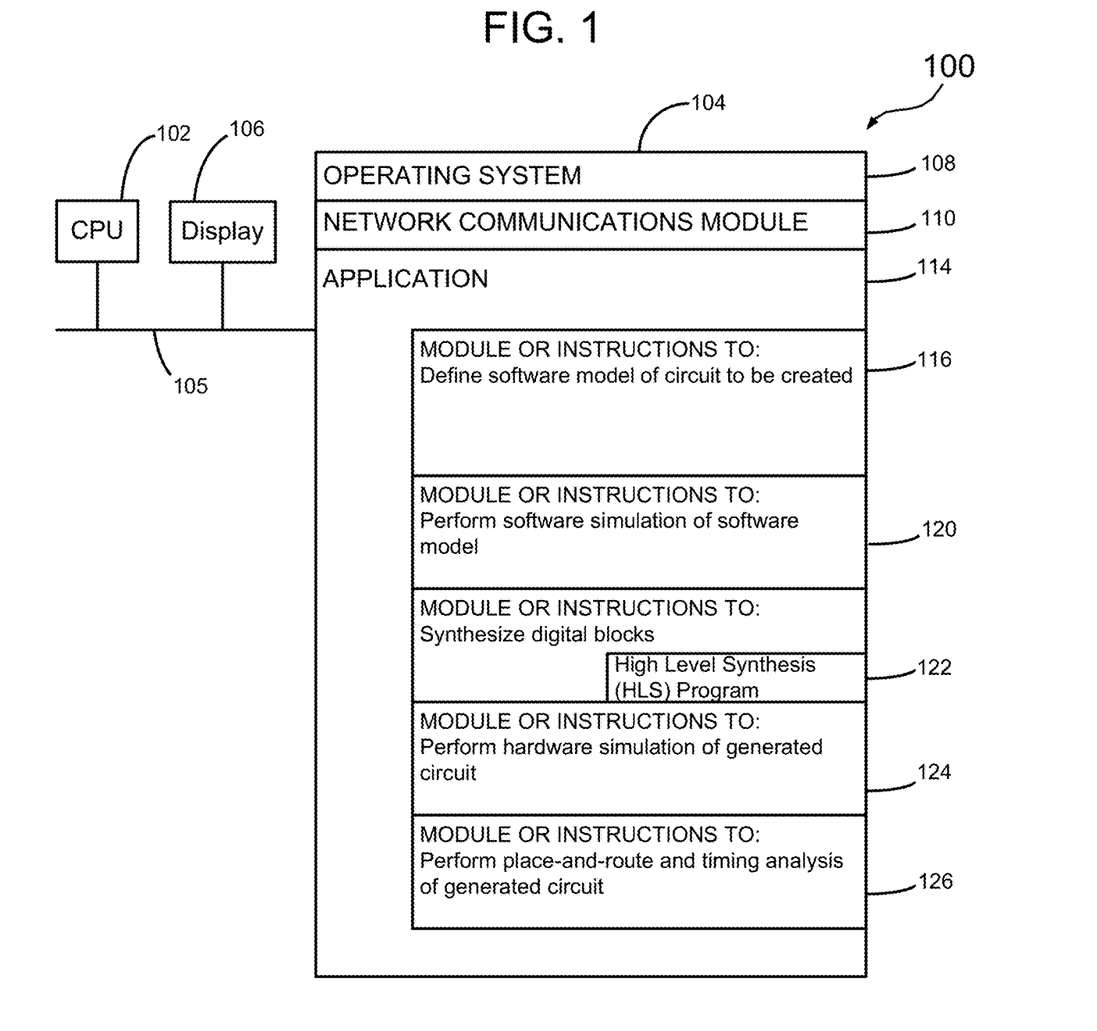
FIG. 1 illustrates one embodiment of an electronic design automation (EDA) system.

FIG. 1 illustrates one embodiment of an electronic design automation system (e.g., a server, a workstation, or other computer system), generally designated 100, that may be used to generate a detailed design of a digital system embodied as a semiconductor circuit. The system 100 may include one or more processors 102 for executing modules, programs and/or instructions stored in a memory 104. The system 100 may also include a display 106 that may be local or remote from the system. One or more communication busses 105 couples the processors to the memory. For some embodiments, the memory 104 may include high-speed main memory in the form of DRAM and may also include bulk memory in the form of one or more magnetic or optical disk-storage devices or solid state storage devices, or network access to cloud storage located remotely from the processors.

With continued reference to FIG. 1, the memory 104, or alternatively memory device(s) within the memory 104, comprises a computer-readable storage medium. In some embodiments, the memory 104 stores a variety of programs, modules and data structures, or a subset or superset thereof. An operating system 108 includes procedures for handling various basic system services and for performing hardware-dependent tasks. A network communications module (or instructions) 110 may be used for connecting the system 100 to other computers via a communication interface (not shown) and one or more communications networks, such as the Internet, other wide area networks, metropolitan area networks, and local area networks. An application or program 114 controls the operation and function of the system.

For some embodiments, and further referring to FIG. 1, the application or program 114 may include or have access to one or more programs, modules, or a subset or superset thereof. For example, a specifications module may be included that defines a software model of the circuit to be designed at 116. A module to perform a software simulation of the software model may also be included, at 120. Respective high-level synthesis (HLS), hardware simulation, and place-and-route modules 122, 124 and 126, are also provided to carry out high-level synthesis, hardware simulation, and place-and-route operations. Further detail regarding embodiments of the HLS program 122 is provided below.

Figure 2:
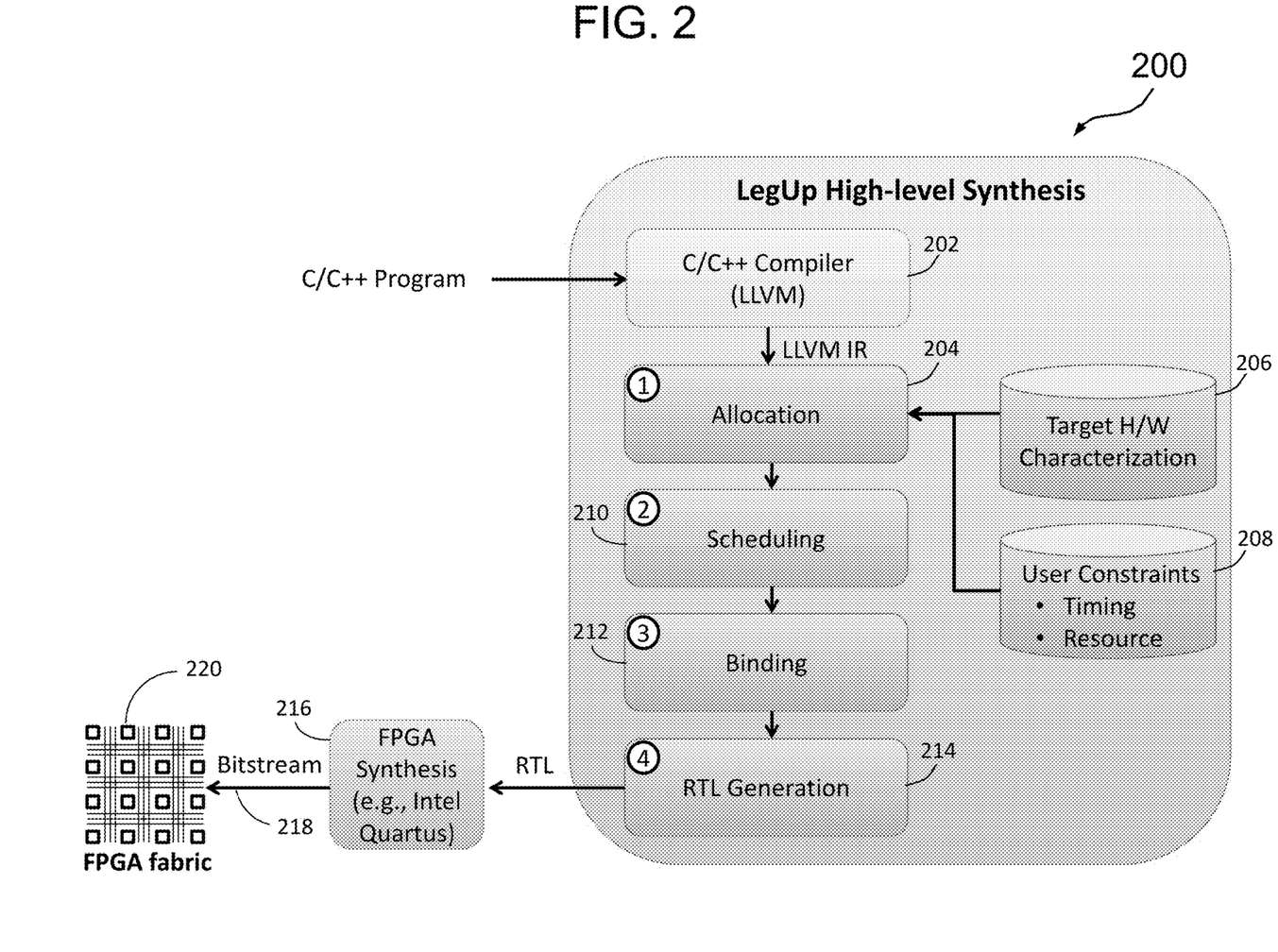
FIG. 2 illustrates one high-level embodiment of a high-level synthesis (HLS) compiler.

FIG. 2 illustrates one embodiment of an HLS compiler, generally designated 200, for use with the HLS program 122 of FIG. 1. The HLS compiler includes a program compiler module 202 that may take the form of software compiler, such as LLVM, that reads in C/C++ code to generate an intermediate representation (an LLVM internal representation of the program). The output of the program compiler module 202 is fed to an allocation module 204.

The allocation module 204 reads in the LLVM intermediate representation along with target hardware information from a target hardware characterization module 206 and user constraints information from a user constraints module 208. The target hardware characterization module 206 includes a database with information associated with various integrated circuits, such as field-programmable gate arrays (FPGA). The database contains various delay and circuit area parameters for each type of operation (such as add, subtract, multiply, etc.) for a particular FPGA. The user constraints module may provide information such as a target clock frequency given by a user, and may also provide additional circuit area constraints. The allocation module 204 determines how many functional hardware units, such as adders, multipliers, memories, etc., based on the inputs from the program compiler 202, the target hardware characterization module 206 and the user constraints module 208.

Further referring to FIG. 2, a scheduler 210 schedules each operation of the program into specific clock cycles. It looks at the data dependencies of the program, such as the output of an addition step incorporated into a multiplication step, to determine which operations occur serially or in parallel. The scheduler also looks at the user-provided target frequency and operational latency from the target hardware characterization module to determine register locations, and the extent of any pipelining stages. For some embodiments, the register locations and number of pipelining stages may be based on the target clock frequency.

With continued reference to FIG. 2, a binding module 212 binds the scheduled operations to functional hardware units considering their physical aspects. For example, a memory on an FPGA may have two ports where a pair of memory accesses can occur in parallel. For such a situation, the binder module may bind one memory operation to a first port, and another memory operation to a second port so they may take place concurrently. An RTL generation module 214 receives the output from the binding module 212 and generates RTL that may be fed to an FPGA synthesis tool 216 (such as Intel Quartus). The FPGA synthesis tool may then generate an FPGA bitstream, at 218, to be programmed onto an FPGA, at 220.

The HLS usability by software engineers can be improved by providing mechanisms within HLS that permit widely used software techniques to be "re-purposed" to control HLS tool behavior, thereby affecting the generated hardware. In multi-threaded parallel software programming, a popular development pattern is the producer-consumer pattern, wherein concurrently operating threads receive (consume) "work to do" from other threads and generate (produce) results that are then consumed by other threads. In a typical producer/consumer implementation, queues/buffers are used between the threads as staging areas for work items that have been produced but not yet consumed.

There exists an analogy between the producer/consumer pattern in multi-threaded software and streaming kernels in hardware, i.e. hardware modules interconnected by FIFO buffers that process their inputs in a pipelined manner and deposit results into output FIFOs. Streaming hardware is popular in applications such as audio/video processing. Commercial HLS tools, such as Xilinx Vivado HLS, support the specification of streaming via special vendor-specific pragmas embedded in the source. Conversely, the computer-implemented method disclosed herein automatically infers streaming hardware behavior by synthesizing instances of the producer-consumer pattern in software, running as Pthreads, into streaming hardware. This methodology allows streaming hardware to be specified using a well-known software methodology with software execution behavior that closely aligns with the hardware behavior.

Each software thread is automatically synthesized into a streaming hardware module. FIFOs between the hardware modules are automatically instantiated, corresponding to the work-queue buffers in the producer/consumer pattern. Exploiting the spatial parallelism available in a large FPGA (such as Xilinx UtraScale) or in some other hardware implementation becomes a matter of forking multiple threads. The described approach brings the added benefit that the multi-threaded code can be executed in parallel fashion in both software and hardware. Debugging and visualization can be done in software—software whose parallel execution matches closely with the parallel hardware execution.

From a software perspective, the producer-consumer programming pattern comprises a finite-size buffer and two classes of threads, a producer and a consumer. The producer stores data into the buffer and the consumer takes data from the buffer to process. This decouples the producer from the consumer, allowing them to naturally run at different rates, if necessary. The producer must wait until the buffer has space before it can store new data, and the consumer must wait until the buffer is non-empty before it can take data. The waiting is usually realized with the use of a software variable, semaphore. A semaphore is a POSIX standard, which allows processes and threads to synchronize their actions. It has an integer value, which must remain non-negative. To increment the value by one, the sem_post function is used, and to decrement the value by one, sem_wait function is called. If the value is already zero, the sem_wait function will block the process, until another process increases the semaphore value with sem_post.

The pseudo-code below shows one example of a typical producer-consumer pattern using two threads:

```
producer_thread {
    while (1) {
        // produce something
        item = produce( );
        // wait for an empty space
        sem_wait(numEmpty);
        // store item to buffer
        lock(mutex);
        write_to_buffer;
        unlock(mutex);
        // increment number of full spots
        sem_post(numFull);
    }
}
consumer_thread {
    while (1) {
        // wait until buffer has data
        sem_wait(numFull);
        // get item from buffer
        lock(mutex);
        read_from_buffer;
        unlock(mutex);
        // increment number of empty spots
        sem_post(numEmpty);
        // consume data
        consume(item);
    }
}
```

In a producer-consumer pattern, the independent producer and consumer threads are continuously running, thus they contain infinite loops. The buffer is implemented as a circular array. Two semaphores are used, one to keep track of the number of spots available in the buffer, and another to keep track of the number of items in the buffer. Observe that updates to the buffer are within a critical section—i.e. a mutex is used enforce mutual exclusion on changes to the buffer itself.

From a hardware perspective, the producer-consumer pattern can be applied to describe streaming hardware. Streaming hardware is always running, just as the producer-consumer threads shown above. Different streaming hardware modules execute concurrently and independently, as with the producer-consumer threads. To create threads in software, one can use Pthreads, which is a standard known and used by many software programmers. Inputs and outputs are typically passed between streaming modules through FIFOs. The circular buffer described above is essentially a FIFO, with the producer writing to one end, and the consumer reading from the other end.

The following is an example of a producer-consumer pattern, implemented using Pthreads, where the streaming modules are connected through FIFOs. In this example, three threads are created, func_A, func_B, and func_C, however, only func_A is shown for clarity:

```
void *func_A(FIFO *in, FIFO *temp) {
    ...
    while (1) {
        // read from FIFO
        int a = fifo_read(in);
        // do work
        ...
        // output to FIFO
        fifo_write(temp);
    }
}
...
void top(FIFO *in, FIFO *out) {
    ...
    pthread_create(func_A, ...);
    pthread_create(func_B, ...);
    pthread_create(func_C, ...);
    ...
}
int main( ) {
    // declare and size FIFOs
    FIFO *in = fifo_malloc(/*width*/32, /*depth*/1);
    FIFO *out = fifo_malloc(/*width*/32, /*depth*/1);
    // invoke top-level function
    top(in, out);
    // fill up the input FIFO, as soon as the FIFO has data
    // the hardware executes
    for (i=0; i<SIZE; ++i) {
        fifo_write(in, in_array[i]);
    }
    // get output from the output FIFO
    for (i=0; i<SIZE; ++i) {
        out_array[i] = fifo_read(out);
    }
    // free FIFOs
    fifo_free(in); fifo_free(out);
    ...
}
```

Observe that the infinite loop in func_A keeps the loop body of the kernel function continuously running. We pipeline this loop, to create a streaming circuit. Pipelining allows multiple data items to be processed concurrently using the same hardware unit, as opposed to having multiple copies of the hardware unit to work on multiple data items, hence pipelining is a key optimization for creating an efficient high-performance circuit. The advantage of using loop pipelining, versus pipelining the entire function, is that there can also be parts of the function that are not streaming (only executed once), such as for performing initializations. The top function, which is called only once, forks a separate thread for each of its sub-functions. The user does not have to specify the number of times the functions are executed—the threads automatically start executing when there is data in the input FIFO. This closely matches the always running behavior of streaming hardware. In this example, each thread is both a consumer and a producer. It consumes data from its previous stage and produces data for its next stage.

The FIFO functions provide users with a software API which can be used to create streaming hardware in HLS. Fifo_malloc sizes the FIFOs in software to be the same as those in hardware. Fifo_write pushes data into one end of a FIFO; previously stored data can be read from the other end with fifo_read. The fifo_read/write functions provide the blocking capability with the use of semaphores. This is described in more detail below. Fifo_free frees any memory allocated by fifo_malloc.

The multi-threaded code above can be compiled, concurrently executed, and debugged using standard software tools. Such portability is an important design consideration, and that a design should not be tied to a particular vendor, as is what happens when many vendor-specific pragmas are required to produce the desired hardware. The method disclosed maintains the software source code as a standard software program.

This section describes a FIFO and its associated functions in an exemplary embodiment. The FIFO is defined as a struct:

```
typedef struct {
    // bit-width of the elements stored in the FIFO
    int width;
    // the number of elements that can be stored
    int depth;
    // data array holding the elements
    long long *mem;
    // keeps track of where in the array to write to
    unsigned writeIndex;
    // keeps track of where in the array to read from
    unsigned readIndex;
    // keeps track of the number of occupied spots
    sem_t numFull;
    // keeps track of the number of empty spots
    sem_t numEmpty;
    // mutual exclusion for data array access
    pthread_mutex_t mutex;
} FIFO;
```

The elements of the struct are used to define the storage, its width/depth, and where to read/write from/to in the storage. The data array is used as a circular buffer to create the FIFO behavior. In this example, the storage type is a long long, making it capable of handling the largest standard C-language integer data type, though it can also be used to hold anything smaller. When compiled to hardware, the width variable is used to parametrize the hardware FIFO, which can be of any arbitrary width. Semaphores are employed to create the producer-consumer behavior between threads and a mutex is used to ensure atomic access to the shared storage. When fifo_malloc is called, it allocates the data array and initializes all member variables, including the semaphores and the mutex. Fifo_free frees all memories which have been allocated.

Using the struct, fifo_write follows the logic described in the producer_thread of the pseudo-code associated with the producer-consumer pattern described earlier, and fifo_read follows the logic of the consumer_thread. Fifo_write first waits until there is an empty spot in the FIFO (using sem_wait on the numEmpty semaphore), then gets the lock, stores the data into the writeIndex position of mem, updates writeIndex, releases the lock, and finally increments numFull. Fifo_read waits until the FIFO is non-empty (using sem_wait on the numFull semaphore), gets the lock, reads the data at the readIndex position of mem, updates readIndex, releases the lock, and finally increments numEmpty.

Figure 3:
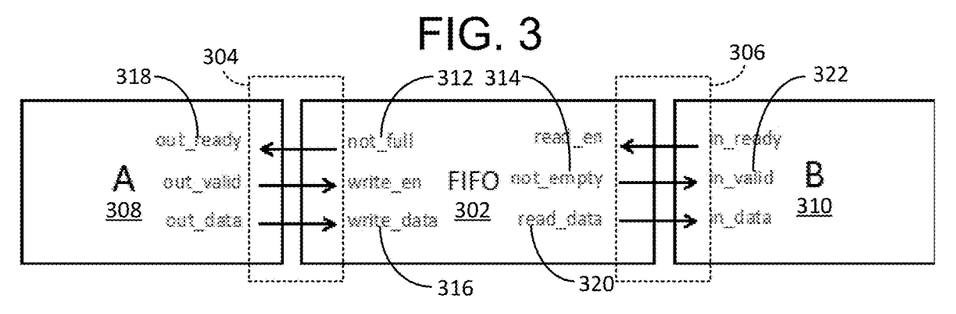
FIG. 3 illustrates one embodiment of first-in-first-out (FIFO) interfaces that correspond to a producer-consumer pattern.

In hardware, a FIFO struct is synthesized into a hardware FIFO. FIG. 3 illustrates hardware in the form of a FIFO 302 with respective write and read interfaces 304 and 306 coupled to respective producer and consumer streaming modules 308 and 310. The FIFO interfaces 304, 306 and respective producer "A" and consumer "B" streaming modules 308, 310 are automatically inferred when invoking a producer-hardware pattern as an input to the HLS compiler (200, FIG. 2). For each FIFO interface, the streaming modules use RVD (Ready, Valid, Data) signals, which are typical hand-shaking interface signals used in streaming architectures. The semaphores of the FIFO struct, which keep track of whether the FIFO is full/empty in software, are turned into the not_full and not_empty signals in hardware, at 312 and 314. On a call to fifo_write for the producer module 308, the not_full signal is checked, and if it is high, the data is written to the FIFO 302 via the write_data signal, at 316. If the not_full signal is low, meaning the FIFO is already full, the out_ready signal of the producer module 308 is de-asserted, at 318, which stalls the module. One specific embodiment of stall logic is described more fully below in FIG. 5. For fifo_read from the consumer module 310, the not_empty signal at 314 is checked, and if it is high, the data is returned via the read_data signal, at 320. If the not_empty signal is low (FIFO is empty), the in_valid signal at 322 is de-asserted, which stalls the consumer module. This implementation removes any additional hardware overhead from the semaphores/mutex, while allowing software to be executed like hardware.

Figure 4A:
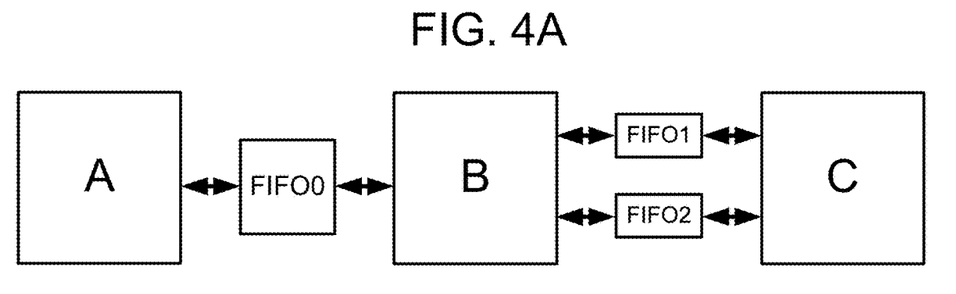
FIG. 4A illustrates multiple streaming modules that employ the FIFO interfaces of FIG. 3.

In a streaming architecture, multiple streaming modules may be chained together, transferring data from one streaming module to the next, as shown in FIG. 4A. The architecture utilizes modules A and B interconnected via FIFO0, and a third module C connected to module B through a pair of FIFOs FIFO1 and FIFO2 instantiated in parallel. This is a typical architecture used in image/video processing applications. In an example embodiment, the architecture shown in FIG. 4A can be created by creating a thread for each of modules A, B, and C, as described above, and passing in FIFO0 as an argument to A and B, and FIFO1 and FIFO2 to B and C. As per Pthread standards, multiple arguments to a thread must be passed by creating a struct which contains all of the arguments, and then passing a pointer to that struct in the pthread_create ( ) routine. In one embodiment, a points-to compiler analysis is applied to automatically determine which FIFOs need to be connected to which hardware modules. In one embodiment, the high-level synthesis tool automatically determines whether a module writes to the FIFO, or reads from the FIFO, and an integrated system generator automatically connects the appropriate input/output FIFO ports to their corresponding streaming module ports.

Figure 4B:
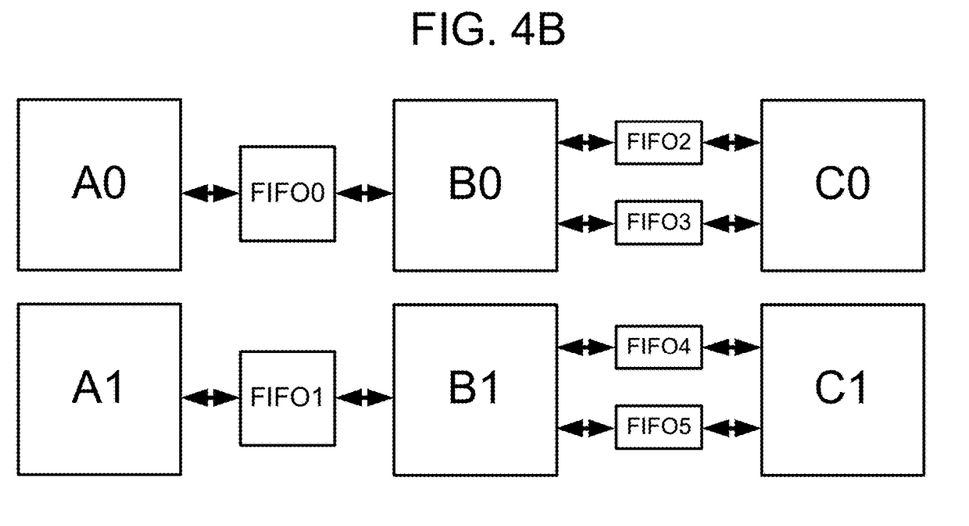
FIG. 4B illustrates multiple replicated versions of the streaming modules of FIG. 4A.

With the producer-consumer threads, all processes, in both software and hardware, commence execution as early as possible (i.e. as soon as there is data in the input FIFO). In one embodiment, all software source code, including the FIFO functions, can be compiled with a standard compiler, such as GCC, and debugged with a standard software-debugging tool, such as GDB. That is, most design effort can be spent at the software stage. An advantage of using Pthreads is for ease of hardware parallelization by replication. In embodiments described herein, each thread is mapped to a hardware instance, hence creating multiple threads of the same function creates replicated hardware instances. For instance, if the application shown in FIG. 4A is completely parallelizable (say data-parallel), one can exploit spatial hardware parallelism by creating two threads for each function, to create the architecture shown in FIG. 4B, which includes two of the architectures of FIG. 4A in parallel. This methodology therefore allows exploiting both spatial (replication) and pipeline hardware parallelism, all from software.

For replication, other HLS tools require the hardware designer to manually instantiate a synthesized core multiple times and make the necessary connections in HDL. This is cumbersome for a hardware engineer and infeasible for a software engineer. More recently, HLS tools have introduced system generator tools, such as the Vivado IP Integrator, which uses a schematic-like block design entry, and allows a user to interconnect hardware modules by drawing wires. This, also, is a foreign concept in the software domain. The disclosed methodology uses purely software concepts to automatically create and connect multiple parallel streaming modules together.

Figure 4C:
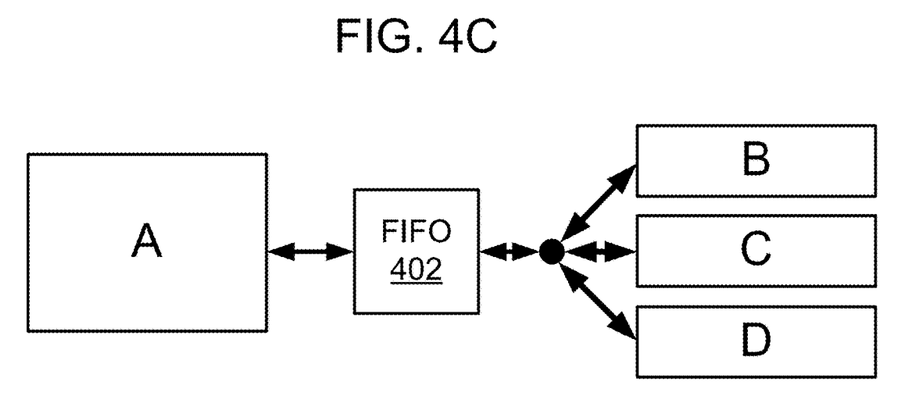
FIG. 4C illustrates one embodiment of the FIFO interfaces of FIG. 3 employed in a "one-to-many" configuration.
Figure 4D:
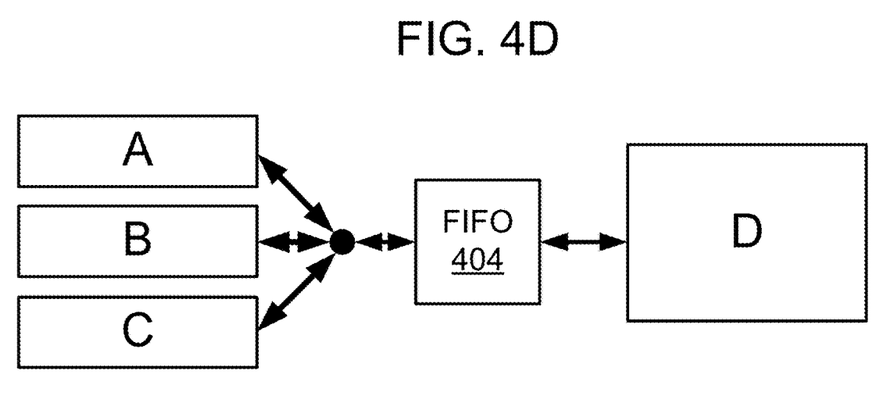
FIG. 4D illustrates one embodiment of the FIFO interfaces of FIG. 3 employed in a "many-to-one" configuration.

The disclosed method is also able to handle more complex architectures, where multiple consumers represented by modules B, C and D receive data from a single producer, module A, through a single FIFO 402, as shown in FIG. 4C. Further, multiple producers, such as modules A, B and C can feed data to a single consumer, such as module D, through a single FIFO 404, as shown in FIG. 4D. The former architecture can be useful for applications with a work queue, where a producer writes to the work queue, and multiple workers (consumers), when ready, take work-items from the queue to process. The latter architecture can be used for applications such as mapReduce, where multiple mappers can map to the same reducer. Both architectures can be created from software by giving the same FIFO argument to the different threads. Arbiters are automatically synthesized to handle contention that may occur when multiple modules try to access the same FIFO in the same clock cycle—modules may stall if not given immediate access. The configurability to have one-to-many, or many-to-one FIFO architectures, with automatic synthesis of arbitration logic, is a unique beneficial aspect of the present disclosure.

Figure 5:
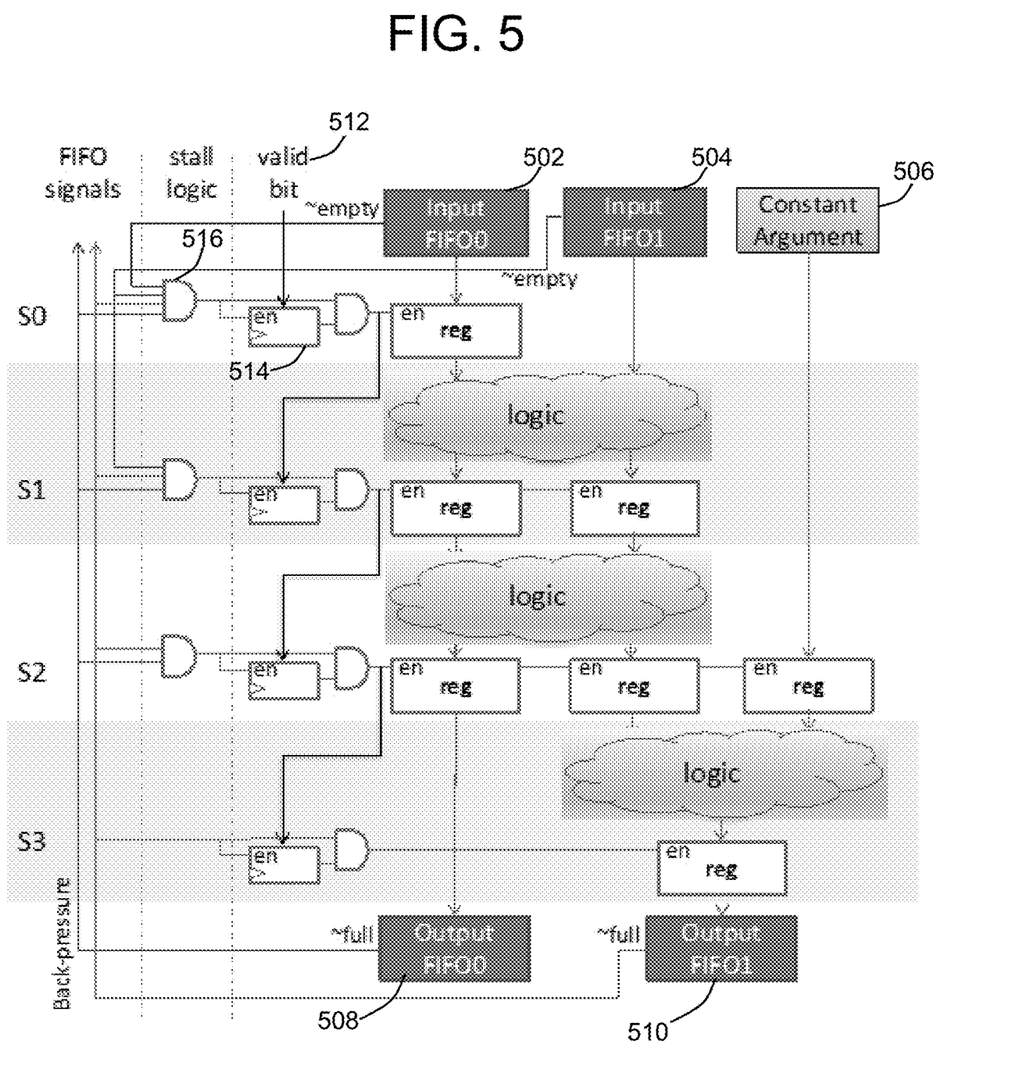
FIG. 5 illustrates one embodiment of a streaming circuit data-path and associated stall logic for the FIFO interfaces of FIG. 3.

FIG. 5 illustrates one embodiment of a streaming circuit data-path and associated stall logic, generally designated 500, for the streaming hardware and FIFO interfaces of FIG. 3. The streaming circuit datapath reflects data flows involving two input FIFOs 502, 504, a non-FIFO argument input 506, and two output FIFOs 508 and 510. Plural pipeline stages S0-S3 include registers "reg" at each stage to store data. Valid bits, at 512, are provided as inputs to a valid bit chain of registers (such as at 514), and are used to indicate which stages of the pipeline contain valid data. Generally, a streaming circuit is a straight-line data-path, without any control flow. We remove any diverging branches with if-conversion and back edges by unrolling any internal loops (those residing inside the while loop). Any sub-functions called within the while loop are inlined. As needed, operations with side effects (i.e. load/store, FIFO read/write) are predicated so that they trigger for the correct if/else conditions.

Further referring to FIG. 5, stall logic 516, ensures that the streaming circuit hardware can stall appropriately and produce a functionally correct result. This directly impacts the QoR (quality-of-result) of the circuit, as stalls increase circuit latency, and the stall logic affects circuit area and maximum frequency (Fmax). It is desirable to stall only when necessary, and also to minimize the stall circuitry. For the architecture shown in FIG. 5, there are two scenarios wherein the circuit can stall: 1) when any of the input FIFOs become empty, and 2) when any of the output FIFOs become full. In both cases, a stall does not necessarily stall the entire pipeline, but only those pipeline stages which absolutely need to stall. For instance, in the case of Input FIFO0, its data is required in S0 (pipeline stage 0). Consequently, if this FIFO becomes empty, only S0 stalls. Data from Input FIFO1 is needed in S1, so if this FIFO is empty, S1 and S0 stall. S0 also needs to stall in this case since its next stage is stalled (allowing it to continue would overwrite valid data in S1). Output FIFO0 is written from S2, hence when this FIFO is full, it stalls S2, S1, and S0. When Output FIFO1 is full, the entire pipeline stalls. In general, a FIFO being full/empty stalls the first pipeline stage where its data is read/written from, and all of the prior pipeline stages. This architecture allows the later pipeline stages to continue making forward progress, even when a FIFO becomes empty/full. For instance, when S0 stalls due to Input FIFO0 only, S1, S2, S3 can continue. When Output FIFO0 is full, valid data in S3 can continue and be written to the Output FIFO1 (given that it is not full).

There are also scenarios where stall circuitry is unnecessary. For instance, a constant argument 506 (such as an integer value), is stored in registers when the module starts and remains unchanged during its execution. We do not create any stall logic for this argument, as it will not be overwritten during the execution. This helps to reduce circuit area and the fan-out of the stall signals, which can become large when there are many FIFOs and pipeline stages.

In summary, there are three conditions for a pipeline stage to be enabled: 1) Its valid bit must be asserted to indicate there is valid data, 2) any input FIFOs, from which its data is needed in this or a downstream pipeline stage, must not be empty, and 3) any output FIFOs, which are written to be from this or a downstream pipeline stage, must not be full. A FIFO can also be shared between multiple modules through an arbiter, as was shown in FIGS. 4C and 4D. In such cases, stalling operates in the same manner, depending on whether it is an input or an output FIFO. For an input FIFO, the grant signal from the arbiter is AND'ed with the not_empty FIFO signal, and this output goes to the stall logic. For an output FIFO, the grant signal is AND'ed with the not_full FIFO signal. Although FIFO memories are primarily described in this disclosure, streaming hardware can also access non-FIFO RAMs, with arbitration and stall logic created as necessary.

EXAMPLES

This section presents exemplary streaming benchmarks which use the producer-consumer pattern with Pthreads, as well as their resulting hardware. Four different applications from various fields are described, including image processing, mathematics/finance and data mining. For each benchmark, two versions are created, a pipelined-only version and a pipelined-and-replicated version. In the pipelined-only version, there are one or more functions which are connected together through FIFOs, as in FIG. 4A, but no modules are replicated. For the pipelined-and-replicated version, each benchmark is parallelized with one or more functions (modules) executing on multiple threads, yielding architectures similar to FIGS. 4B and 4C. In both versions, all kernel functions are fully pipelined with multiple pipeline stages, and receive/output new data every clock cycle (initiation interval=1). Each benchmark also includes golden inputs and outputs to verify correctness. Each generated circuit was synthesized into the Altera Stratix V FPGA (5SGSMD8K1F40C2) with Quartus 15.0. For performance and area comparison, another commercial HLS tool was also used to synthesize one of the pipelined-only benchmarks, Canny, targeting the Xilinx Virtex 7 FPGA (XC7VX980TFFG1930-2). The other commercial tool does not support replicating hardware from software, thus none of the pipelined-and-replicated benchmarks were used for this tool. For both the disclosed methodology, as well as the other commercial HLS tool, a 3 ns (333 MHz) clock period constraint was supplied; this is used by the scheduling stage of HLS to determine which operations can be chained together in a single clock cycle.

Figure 6A:
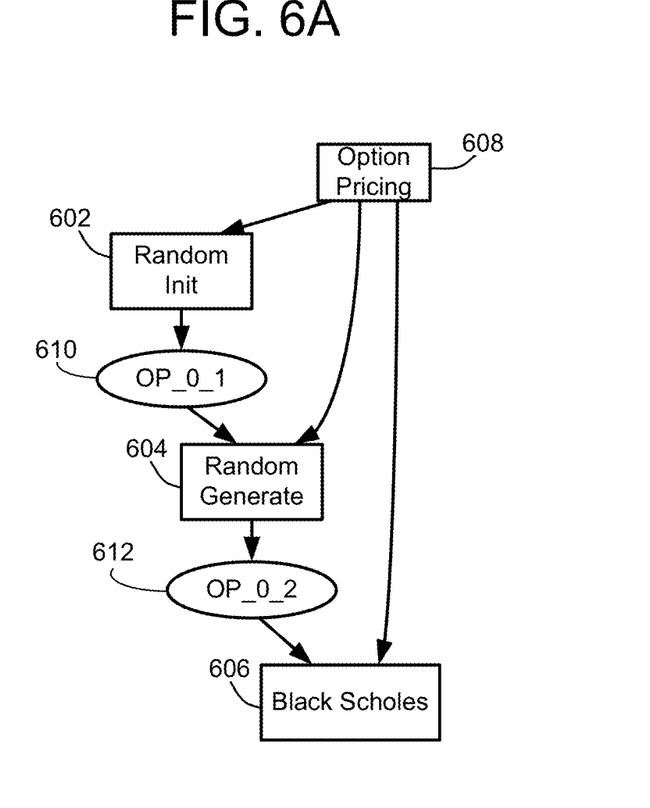
FIG. 6A illustrates a system diagram for one example of a system that employs hardware modules in a pipelined configuration.
Figure 6B:
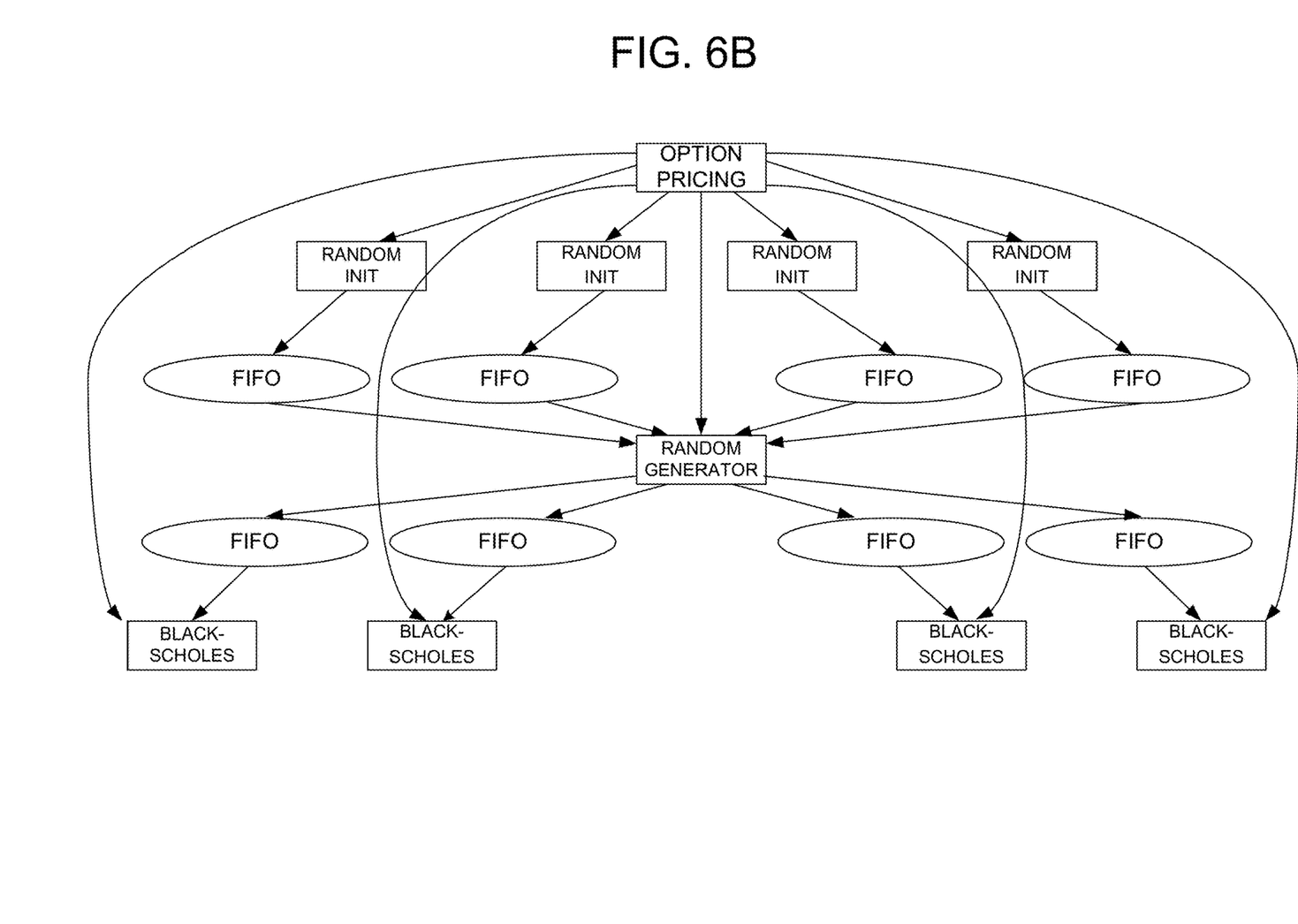
FIG. 6B illustrates a system diagram similar to that of FIG. 6A, that employs hardware modules in a pipelined and replicated configuration.

Mandelbrot is an iterative mathematical benchmark which generates a fractal image. For each pixel in a 512×512 image, it iteratively computes whether it is bounded (inside the Mandelbrot set) or diverges to infinity (outside the Mandelbrot set), and displays its color accordingly. Computations are done in fixed-point for this benchmark. Each pixel is independent from others, hence this application is easily parallelizable. In the pipelined-and-replicated version with four threads, each thread processes a quadrant of the image. The Black-Scholes benchmark estimates the price of European-style options. It uses Monte Carlo simulation to compute the price trajectory for an option using random numbers. 10,000 simulations are conducted, with 256 time steps per simulation. The system diagram for the pipelined-only version is shown in FIG. 6A as a dot graph. This dot graph shows the different modules, as well as the connections between them. The rectangles represent hardware modules, while ovals represent FIFOs. This benchmark consists of three kernel functions, random_init, at 602, random_generate, at 604, and blackscholes, at 606, and the wrapper function, option_pricing, at 608, that creates the necessary intermediate FIFOs, at 610 and 612, between the kernel functions and forks their threads. The random_init and random_generate are an implementation of the Mersenne twister, which is a widely used pseudo-random number generator. These two kernels were originally written in the OpenCL programming language. The init function 602 initializes the random number generator in the generate function 604. The blackscholes function 606 uses the random numbers to price a European option using the Black-Scholes formula. In the pipelined-and-replicated version, shown in FIG. 6B, the initialization and the Black-Scholes functions are parallelized: each with four threads. For the generate function, its logic is modified to receive four initializations from the initialization threads, and generate four random numbers concurrently. Each random number is used by an independent Black-Scholes' thread, with four threads concurrently computing four prices.

Figure 7A:
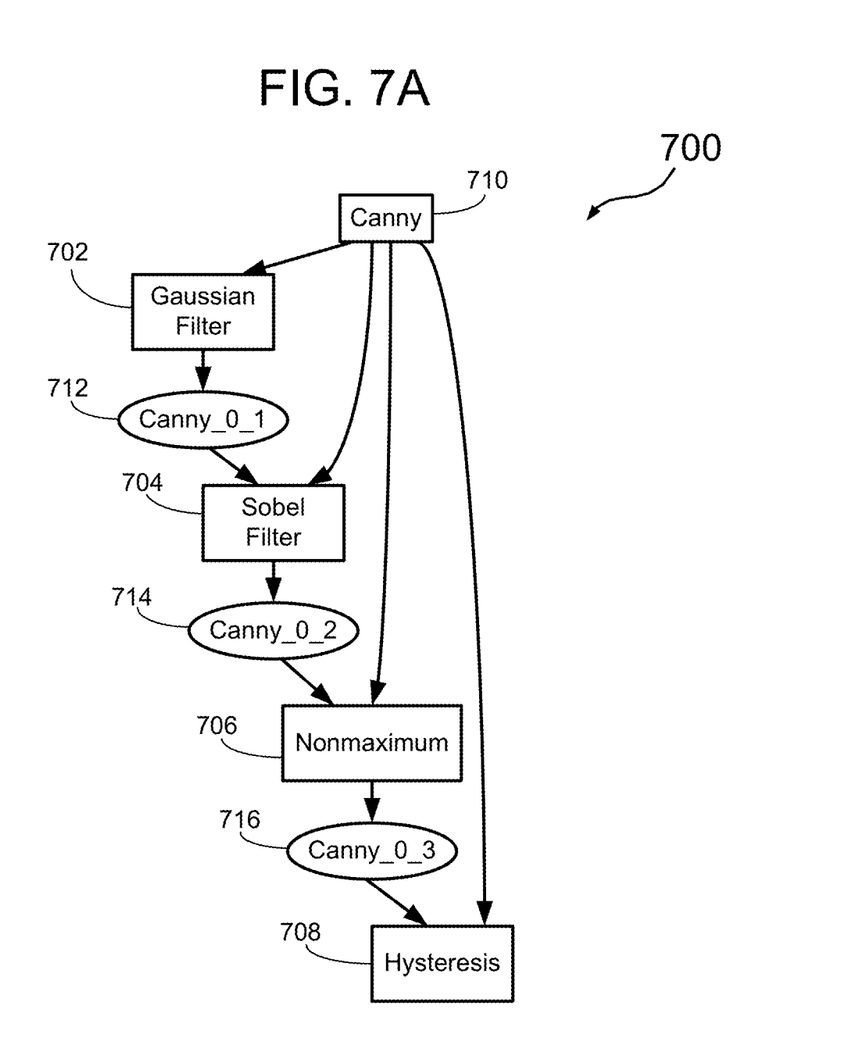
FIG. 7A illustrates a system diagram similar to FIG. 6A, for another system that employs hardware modules in a pipelined configuration.

The Canny benchmark implements the Canny edge detection algorithm for a 512×512 image. Referring now to FIG. 7A, the multi-stage method, generally designated 700, is implemented with four kernel functions, gaussian filter, at 702, sobel filter, at 704, nonmaximum suppression, at 706, and hysteresis, at 708, as well as its wrapper function canny, at 710. Corresponding FIFOs 712, 714 and 716 are disposed between the hardware function modules. The Gaussian filter 702 first smooths the input image to remove noise. The Sobel filter 704 then finds the intensity gradients. The non-maximum suppressor 706 removes pixels not considered to be part of an edge. Then finally, hysteresis 708 finalizes the edges by suppressing all the other weak edges. Every clock cycle, each kernel receives a new pixel from the previous kernel stage and outputs a pixel to its next-stage kernel.

Figure 7B:
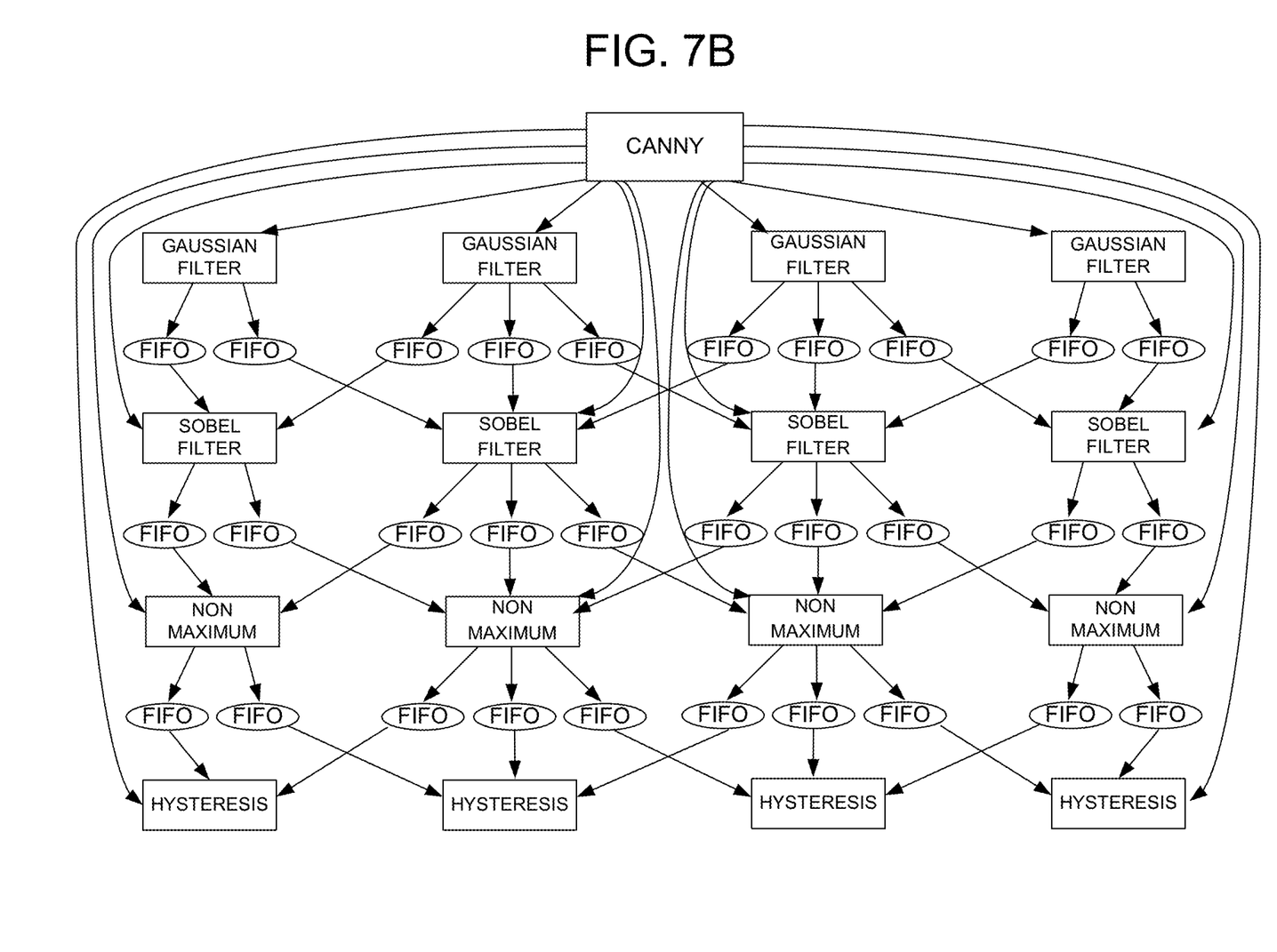
FIG. 7B illustrates a system diagram similar to that of FIG. 6B, that employs hardware modules in a pipelined and replicated configuration.

In a pipelined-and-replicated version, shown in FIG. 7B, each kernel function is parallelized with four threads. The image is divided into four sections (this time with 128 rows each), with each section to be processed by a set of replicated modules (i.e. rows 0-127 are processed by a first set of copies of the Gaussian, Sobel, non-maximum suppression, and hysteresis kernel modules). The data required by each set of modules, however, is not completely mutually exclusive, since each kernel uses either a 5×5 or a 3×3 filter. For instance, the Gaussian filter, which uses a 5×5 filter, requires up to 2 rows outside of its assigned section. For example, when working on row 127, values of pixels in rows 128 and 129 are needed, which belong to the next section of rows. To manage this, pixel values for border rows are communicated between adjacent copies of the kernels. Moreover, to minimize stall time arising from needed data in border rows, even-numbered sections (containing rows 0-127 and rows 256-383) proceed from the bottom row to the top; odd-numbered sections (containing rows 128-255 and rows 384-511) proceed from the top row to the bottom.

The k-means benchmark implements the k-means clustering algorithm used in data mining. It partitions n data points into one of k clusters defined by centroids. The example has 1,000 data points with four clusters. The mapReduce programming paradigm is used to implement k-means. A mapper iteratively maps each data point to a cluster, and a reducer updates the centroids with each data point. In the pipelined-only version, there is a single mapper and a single reducer. The mapper maps all data points to one of the clusters, and the reducer updates the centroids for all clusters. In the pipelined-and-replicated version, there are four mappers and four reducers. Each mapper maps to a single cluster, and each reducer updates the centroid for a single cluster. Each mapper can write to any of the reducers using the architecture shown in FIG. 4D.

Table 1 below shows the performance and area results for all the pipelined-only benchmarks compiled with the HLS compiling apparatus and methods described herein. There are three performance metrics (total wall-clock time (#cycles×clock period), total number of clock cycles, and Fmax) and four area metrics (number of ALMs, registers, DSPs, and M20Ks). As previously mentioned, all circuits have an II=1, and were given a clock period constraint of 3 ns (333 MHz), except for Black-Scholes, which was given 6 ns (167 MHz). All circuits run roughly within +/−10% of the target frequency.

TABLE 1

Performance and area results for pipelined-only benchmarks.

| Benchmark | Time (us) | Cycles | Fmax (MHz) | ALMs | Registers | DSPs | M20K |
|---|---|---|---|---|---|---|---|
| Mandelbrot | 738.6 | 262208 | 355 | 1101 | 2746 | 112 | 0 |
| Black-Scholes | 16736.7 | 2560714 | 153 | 8575 | 28963 | 45 | 5 |
| Canny | 787.95 | 264752 | 336 | 1246 | 2415 | 0 | 10 |
| K-means | 70.4 | 20908 | 297 | 8499 | 20681 | 16 | 115 |
| Geomean | 910.01 | 246910.57 | 271.33 | 3162.11 | 7938.86 | 16.85 | 8.71 |

Table 2 shows another commercial HLS tool's result for the Canny benchmark. The performance results are nearly identical to that of the HLS apparatus and methods described herein, with a total wall-clock time that is 0.6% higher. Targeting the Virtex 7 FPGA, the area is reported in terms of LUTs, registers, DSP48s, and 18 KB Block RAMS. The circuit generated by the other commercial tool uses 15% more LUTs, but it also uses 19% less registers and half the number of RAMs. For this performance/area comparison, note that there are differences in the FPGA architectures and the vendor FPGA CAD tools that can lead to different results. For example, although Virtex 7 and Stratix V are fabricated in the same 28 nm TSMC process, Stratix V uses fracturable 6-LUTs that are more flexible than Virtex 7's fracturable 6-LUTs. Likewise, one can expect that two vendor's FPGA CAD tools employ different RTL/logic synthesis, place-and-route algorithms.

pipelined-only case to meet II=1. In the pipelined-and-replicated case, each reducer handled one cluster, with two dividers each, thus the total number of dividers remained the same.

TABLE 2

Performance and area results for Canny benchmark for another commercial HLS tool compared to LegUp HLS.

| Benchmark | Time (us) | Cycles | Fmax (MHz) | LUTs | Registers | DSP48s | BRAMs |
|---|---|---|---|---|---|---|---|
| Canny | 792.64 | 264743 | 334 | 1427 | 1948 | 0 | 5 |
| Ratio vs. Table 1 | 1.006 (0.994x) | 1.00 (1.00x) | 0.99 | 1.15 | 0.81 | 1 | 0.5 |

Table 3 shows the results for the HLS apparatus and methods described herein, for the pipelined-and-replicated benchmarks. Compared to pipelined-only, a geometric mean speedup of 2.8× is observed in terms of total wall-clock time. Clock cycle improvement is higher with 3.29×, but Fmax drops 15% on average, due to higher resource utilization and more complex hardware architectures. On a per benchmark basis, Black-Scholes shows close to linear speedup in wall-clock time: 3.89×. Mandelbrot also shows linear speedup in clock cycles, but Fmax drops due to the use of 448 DSP blocks. Canny shows 3.74× speedup in clock cycles, and 2.98× speedup in wall-clock time. For k-means, the work load for each mapper/reducer, and thus the speedup from parallelization, is dependent on the initial coordinates of the centroids and the data points. Each centroid was initialized to be at the centre of each quadrant of the entire x/y space, and randomly generate the initial data point coordinates. With this, the four mappers/reducers obtain 1.95× speedup in clock cycles and 1.67× in wall-clock time.

Overall, the disclosed methodology allows the synthesis of a diverse space of streaming hardware architectures that can be pipelined or pipelined and replicated, all from software. For massively parallel applications, replication of streaming hardware is achieved by creating multiple software threads. For the Canny benchmark, the streaming hardware showed very competitive results to that of a commercial tool. The pipelined-only circuits provide high throughput, with an initiation interval (II)=1, while the pipelined-and-replicated circuits further improve performance, at the expense of FPGA resources.

While many of the embodiments described herein relate to FPGA applications, the concepts described herein may be applicable to a variety of integrated circuit applications other than FPGAs. For example, while RTL that is generated by the described HLS tool may be fed to an FPGA synthesis tool to be programmed onto an FPGA, it could alternatively

TABLE 3

Performance and area results for pipelined and replicated benchmarks.

| Benchmark | Time (us) | Cycles | Fmax (MHz) | ALMs | Registers | DSPs | M20K |
|---|---|---|---|---|---|---|---|
| Mandelbrot | 231.8 | 65606 | 283 | 4192 | 11006 | 448 | 0 |
| Black-Scholes | 4297 | 640252 | 149 | 19182 | 55843 | 180 | 20 |
| Canny | 264.8 | 70706 | 267 | 7396 | 14232 | 48 | 76 |
| K-means | 42.2 | 10712 | 254 | 11218 | 25919 | 64 | 120 |
| Geomean | 324.81 | 75102.66 | 231.25 | 9037.68 | 21820.8 | 125.46 | 20.25 |
| Ratio vs. Table 1 | 0.36 (2.80x) | 0.30 (3.29x) | 0.85 | 2.86 | 2.75 | 7.45 | 2.32 |

In terms of area, the pipelined-and-replicated benchmarks show average increases of 2.86×, 2.75×, 7.45×, and 2.32×, in ALMs, registers, DSPs, and M20Ks, respectively. For DSP usage, all benchmarks increased linearly by a factor of four, with the exception of Canny. In the pipelined-only case, the compiler was able to optimize multiplications with constant filter coefficients, however this optimization did not occur in the replicated case, due to the structural code changes, utilizing 48 DSP blocks. For ALMs, the biggest relative increase was with Canny, which again, for the replicated scenario, the compiler was not to optimize the program as effectively as the pipelined-only; and, additional logic and FIFOs were added to allow communication of the border rows. The smallest relative increase was with k-means, where most of the ALMs and M20Ks were used by eight dividers, used to average the x and y coordinates for the four centroids. Eight dividers were also needed in the be fed to an application-specific integrated circuit (ASIC) or other form of IC synthesis tool to create an integrated circuit chip.

Those skilled in the art will appreciate that the methods, systems, and apparatus described herein allows standard software techniques to specify pipeline and spatial hardware parallelism. The embodiments described herein allow software-threaded programs to model streaming hardware with greater accuracy. The closer alignment between software and hardware allows a designer to better understand the generated hardware. It also enables more debugging to happen in software, which is much less difficult and time consuming than hardware debugging. Using Pthreads can open up many options, such as creating multiple streaming kernels that work concurrently. Embodiments herein also permit the creation of circuit architectures that are not feasible to realize in other HLS tools, such as a FIFO with multiple writers, where the arbitration is also automatically generated.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using field-programmable gate array (FPGA) technology, metal oxide semiconductor (MOS) technology, bipolar technology or any other technology in which logical and analog circuits may be implemented. With respect to terminology, a signal is said to be "asserted" when the signal is driven to a high logic state (or charged to a high logic state) to indicate a particular condition. Conversely, a signal is said to be "de-asserted" to indicate that the signal is driven to a low logic state (discharged) to the state other than the asserted state. A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{<signalname>}$') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A computer-implemented method for synthesizing a digital circuit, comprising:
   receiving a multi-threaded software program with at least one Pthread;
   generating a register-transfer level (RTL) hardware description of the at least one Pthread; and
   automatically inferring generation of parallel hardware RTL in response to receiving the at least one Pthread.

2. The computer-implemented method according to claim 1, further comprising:
   receiving a Pthreads application programming interface (API) to create at least one thread per processing software function; and
   generating RTL representing at least one parallel hardware module per processing software function.

3. The computer-implemented method according to claim 1, further comprising:
   automatically generating RTL representing a number of parallel hardware modules per processing software function based on the corresponding number of Pthreads used for the given processing software function.

4. The computer-implemented method according to claim 3, further comprising:
   automatically detecting synchronization requirements between the multiple Pthreads; and
   generating RTL representing synchronization logic and arbitration logic corresponding to the parallel modules.

5. A non-transitory computer-readable storage medium, the medium storing a software application that when executed by a computer system will cause the computer system to:
   in response to a command from a client to commence operations for a digital design flow for a digital system, receive a multi-threaded software program with at least one Pthread;
   generate a register-transfer level (RTL) hardware description of the at least one Pthread; and
   automatically infer generation of parallel hardware RTL in response to receiving the at least one Pthread.

6. The non-transitory computer-readable storage medium of claim 5, further comprising a software application component that when executed by a computer system will cause the computer system to:
   receive a Pthreads application programming interface (API) to create at least one thread per processing software function; and
   generate RTL representing at least one parallel hardware module per processing software function.

7. The non-transitory computer-readable storage medium of claim 6, further comprising instructions that when executed by a computer system will cause the computer system to:
   automatically generate RTL representing a number of parallel modules per processing software function based on the corresponding number of Pthreads used for the given processing software function.

8. The non-transitory computer-readable storage medium of claim 7, further comprising a software application component that when executed by a computer system will cause the computer system to:
   automatically detect synchronization requirements between the multiple Pthreads; and generate RTL representing synchronization logic and arbitration logic corresponding to the parallel modules.

9. A computer-implemented method, comprising:
performing high-level synthesis (HLS) for a field-programmable gate array (FPGA) or application-specific integrated circuit (ASIC) by
receiving a multi-threaded software program with at least one Pthread;
generating a register-transfer level (RTL) hardware description of the at least one Pthread; and
automatically inferring generation of parallel hardware RTL in response to receiving the at least one Pthread.

10. The computer-implemented method according to claim 9, further comprising:
receiving a Pthreads application programming interface (API) to create at least one thread per processing software function; and
generating RTL representing at least one parallel hardware module per processing software function.

11. The computer-implemented method according to claim 9, further comprising:
automatically generating RTL representing a number of parallel modules per processing software function based on the corresponding number of Pthreads used for the given processing software function.

12. The computer-implemented method according to claim 11, further comprising:
automatically detecting synchronization requirements between the multiple Pthreads; and
generating RTL representing synchronization logic and arbitration logic corresponding to the parallel modules.

* * * * *